United States Patent
Kodera et al.

(10) Patent No.: US 10,235,306 B2
(45) Date of Patent: Mar. 19, 2019

(54) STORAGE DEVICE COMPATIBLE WITH SELECTED ONE OF MULTIPLE INTERFACE STANDARDS

(71) Applicant: Toshiba Memory Corporation, Tokyo (JP)

(72) Inventors: Shunsuke Kodera, Yokohama Kanagawa (JP); Yoshio Furuyama, Yokosuka Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 9 days.

(21) Appl. No.: 15/446,910

(22) Filed: Mar. 1, 2017

(65) Prior Publication Data

US 2018/0039583 A1    Feb. 8, 2018

(30) Foreign Application Priority Data

Aug. 4, 2016   (JP) ................. 2016-153861

(51) Int. Cl.
*G06F 13/10*  (2006.01)
*G06F 11/10*  (2006.01)
(Continued)

(52) U.S. Cl.
CPC ........ *G06F 13/102* (2013.01); *G06F 11/1068* (2013.01); *G06F 13/1668* (2013.01); *G06F 13/4022* (2013.01); *G06F 13/4068* (2013.01); *G06F 13/4282* (2013.01); *G11C 7/10* (2013.01); *G11C 7/1075* (2013.01); *G11C 16/0483* (2013.01); *G11C 16/08* (2013.01); *G11C 16/10* (2013.01); *G11C 16/102* (2013.01);
(Continued)

(58) Field of Classification Search
CPC ............................ G06F 11/1068; G11C 16/00
See application file for complete search history.

(56) References Cited

U.S. PATENT DOCUMENTS 7,430,625 B2    9/2008 Floman et al.
7,631,245 B2 *  12/2009 Lasser ................. G06F 11/1068
                                                   365/185.17
(Continued)

FOREIGN PATENT DOCUMENTS

JP    2009510560 A    3/2009
JP    2013200678 A    10/2013
JP    5364036 B2      12/2013

OTHER PUBLICATIONS

Toshiba Datasheet TC58NVG0S3HTA00, Aug. 31, 2012, 51 pages.
(Continued)

*Primary Examiner* — Brian T Misiura
(74) *Attorney, Agent, or Firm* — Kim & Stewart LLP

(57) ABSTRACT

A storage device includes a nonvolatile semiconductor memory module, a first interface circuit, and a second interface circuit conforming to an interface standard different from an interface standard of the first interface circuit. One of the first interface circuit and the second interface circuit is connected to the nonvolatile semiconductor memory module via first wiring, and to terminals of the storage device for connection to a host via second wiring. The other one of the first interface circuit and the second interface circuit is not connected to either the nonvolatile semiconductor memory module or the terminals.

11 Claims, 5 Drawing Sheets

(51) Int. Cl.

| | |
|---|---|
| *G06F 13/16* | (2006.01) |
| *G06F 13/40* | (2006.01) |
| *G06F 13/42* | (2006.01) |
| *G11C 16/08* | (2006.01) |
| *G11C 16/10* | (2006.01) |
| *G11C 16/16* | (2006.01) |
| *G11C 16/26* | (2006.01) |
| *G11C 7/10* | (2006.01) |
| *G11C 16/04* | (2006.01) |
| *G11C 29/52* | (2006.01) |

(52) U.S. Cl.
CPC .............. *G11C 16/16* (2013.01); *G11C 16/26* (2013.01); *G11C 29/52* (2013.01); *G11C 2207/107* (2013.01)

(56) References Cited

U.S. PATENT DOCUMENTS

| | | |
|---|---|---|
| 8,996,782 B2 | 3/2015 | Ide et al. |
| 9,021,182 B2 | 4/2015 | Park et al. |
| 2005/0070157 A1* | 3/2005 | Neo ........................ H01R 31/02 439/542 |
| 2011/0242906 A1 | 10/2011 | Kim |
| 2018/0113652 A1* | 4/2018 | Kodera ................. G06F 3/0679 |

OTHER PUBLICATIONS

Toshiba Datasheet TC58BVG0S3HTA00, Aug. 31, 2012, 44 pages.
Taiwan Office Action dated Mar. 5, 2018, filed in Taiwan counterpart Application No. 106102987, 10 pages (with translation).

\* cited by examiner

STORAGE DEVICE COMPATIBLE WITH SELECTED ONE OF MULTIPLE INTERFACE STANDARDS

CROSS-REFERENCE TO RELATED APPLICATIONS

This application is based upon and claims the benefit of priority from Japanese Patent Application No. 2016-153861, filed Aug. 4, 2016, the entire contents of which are incorporated herein by reference.

FIELD

Embodiments described herein relate generally to a storage device.

BACKGROUND

As a storage device, a NAND flash memory is widely known.

DETAILED DESCRIPTION

Figure 1:
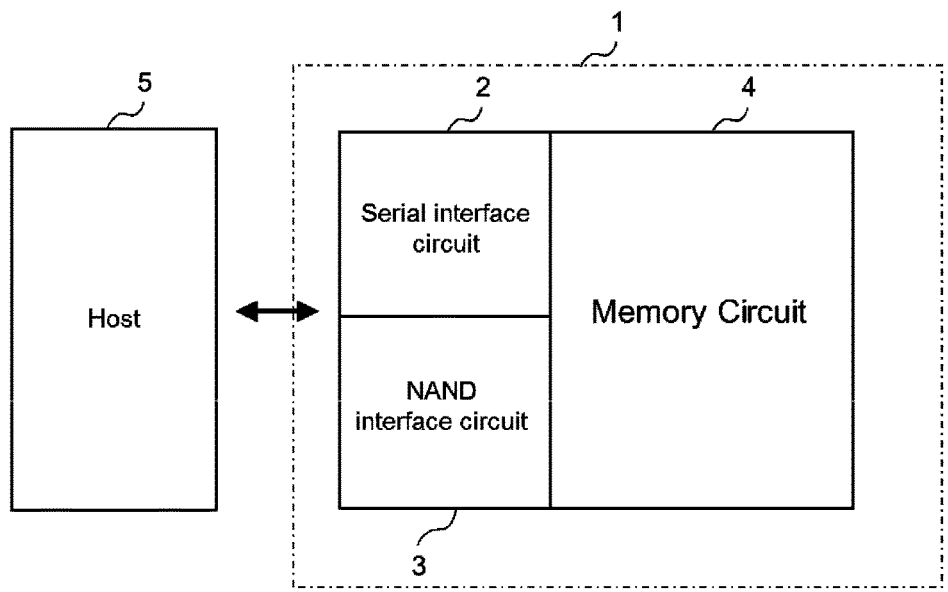
FIG. 1 illustrates a schematic configuration of a memory system according to a first embodiment.

An embodiment provides a storage device including a plurality of types of interface circuits for communication with a host.

In general, according to an embodiment, a storage device includes a nonvolatile semiconductor memory module, a first interface circuit, and a second interface circuit conforming to an interface standard different from an interface standard of the first interface circuit. One of the first interface circuit and the second interface circuit is connected to the nonvolatile semiconductor memory module via first wiring, and to terminals of the storage device for connection to a host via second wiring. The other one of the first interface circuit and the second interface circuit is not connected to either the nonvolatile semiconductor memory module or the terminals.

Hereinafter, embodiments will be described with reference to the drawings. In the following description, elements having the same function and configuration will be described with a common reference character.

1. First Embodiment

A memory system (storage device) according to a first embodiment will be described.

1.1 Configuration of Memory System 1.1.1 Schematic Configuration

First, a schematic configuration of the memory system according to the present embodiment will be described with reference to FIG. 1. FIG. 1 illustrates a schematic configuration of the memory system according to the present embodiment.

As depicted in FIG. 1, a memory system (storage device) 1 includes a serial interface circuit 2, a NAND interface circuit 3, and a memory circuit 4. The serial interface circuit 2, the NAND interface circuit 3, and the memory circuit 4 are disposed on the same semiconductor substrate.

The serial interface circuit 2 complies with Serial Peripheral Interface (SPI). The serial interface circuit 2 communicates with a host apparatus 5 in accordance with an SPI protocol. The NAND interface circuit 3 complies with an interface of a NAND flash memory. The NAND interface circuit 3 communicates with the host apparatus 5 in accordance with a protocol set for the interface of the NAND flash memory. The memory circuit 4 includes a memory cell array provided including a plurality of memory cells.

One of the serial interface circuit 2 and the NAND interface circuit 3 operates. If the serial interface circuit 2 is selected, the serial interface circuit 2 communicates with the host apparatus 5 and the NAND interface circuit 3 does not operate. On the other hand, if the NAND interface circuit 3 is selected, the NAND interface circuit 3 communicates with the host apparatus 5 and the serial interface circuit 2 does not operate. For example, when the host apparatus 5 sends a write instruction to the memory system 1, the selected one of the serial interface circuit 2 and the NAND interface circuit 3 receives the write instruction of the host apparatus 5. At this time, the write instruction which the host apparatus 5 sends conforms to the interface of the selected one of the serial interface circuit 2 and the NAND interface circuit 3. That is, the host apparatus 5 recognizes which of the serial interface circuit 2 and the NAND interface circuit 3 is selected and communicates with the memory system 1 in accordance with the protocol of the interface of the selected circuit. As will be described below, only one of the serial interface circuit 2 and the NAND interface circuit 3 is connected to external connecting terminals of the memory system 1. A determination as to which interface circuit is selected, i.e., the serial interface circuit 2 or the NAND interface circuit 3, is made based on selective wire bonding which is performed on these external connecting terminals and setting data stored in ROM, for example.

1.1.2 Detailed Configuration

Figure 2:
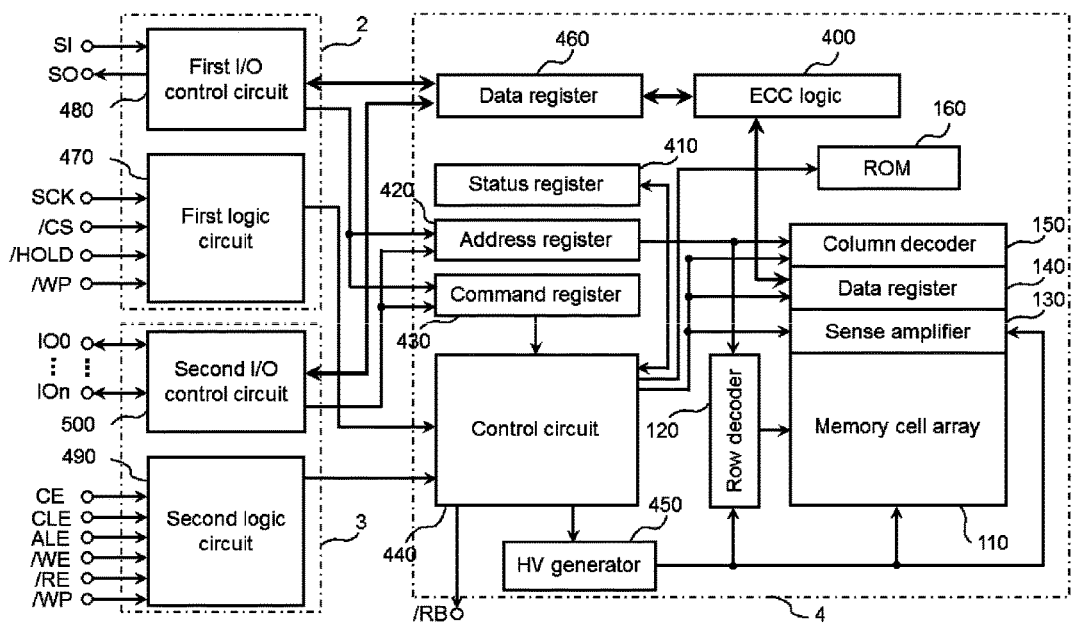
FIG. 2 illustrates a detail configuration of the memory system according to the first embodiment.

FIG. 2 is a detail configuration of the memory system 1 according to the present embodiment.

The memory circuit 4 includes a memory cell array 110, a row decoder 120, a sense amplifier 130, a data register 140, a column decoder 150, ROM 160, an ECC circuit 400, a status register 410, an address register 420, a command register 430, a control circuit 440, a voltage generating circuit 450, and a data register 460.

The memory cell array 110 includes a plurality of nonvolatile memory cells which are aligned along rows and columns. In addition, the memory cells in the same row are connected to the same word line, and the memory cells in the same column are connected to the same bit line. Reading and writing of data are collectively performed on the plurality of memory cells connected to the same word line. This unit is called a page. Data of one page includes net data and management data. The net data are managed in units of a sector. For example, in the present embodiment, one page includes four sectors and each sector has a data size of 512 bytes. The management data include ECC data (parity) for error correction, for example. Error correction is performed for each sector. Therefore, the management data include ECC data prepared for each sector. The memory cell array 110 includes a plurality of NAND strings. Each NAND string includes a plurality of memory cells in the same column that is connected in series. One end of the NAND string is connected to a corresponding bit line via a select transistor. Moreover, erasing of data is collectively performed on a plurality of pages. These pages are called a block. Each memory cell may be a single level cell (SLC) that stores 1-bit data therein or a multilevel cell (MLC) that stores multi-bit data therein.

The row decoder 120 decodes a row address specifying a row of the memory cell array 110. Then, the row decoder 120 selects a word line in accordance with the decoding result and applies a voltage necessary for writing, reading, and erasing of data.

At the time of reading data, the sense amplifier 130 senses the data read from the memory cell array 110 and transfers the data to the data register 140. At the time of writing data, the sense amplifier 130 transfers the data in the data register 140 to the memory cell array 110.

The data register 140 temporarily holds one page of write data or read data.

The column decoder 150 decodes a column address specifying a column of the memory cell array 110. Then, in accordance with the decoding result, the column decoder 150 transfers data to the data register 140 at the time of writing, and reads data from the data register 140 at the time of reading.

The ROM 160 stores setting data for activating only one of the serial interface circuit 2 and the NAND interface circuit 3.

The ECC circuit 400 performs error detection and error correction processing. More specifically, at the time of writing data, the ECC circuit 400 generates parity for each sector based on data received from the host apparatus 5. Then, the control circuit 440 transfers the parity and the net data to the data register 140. At the time of reading data, the ECC circuit 400 generates syndrome for each sector based on the parity included in the data transferred from the data register 140 and detects an error. Then, if an error is detected, the ECC circuit 400 identifies a bit position thereof and corrects the error. The number of error bits which can be corrected per sector is, for example, 8 bits per sector in the present embodiment. Moreover, the ECC circuit 400 can output the number of error bits detected in each sector to the status register 410 as status information.

The serial interface circuit 2 includes a first logic circuit 470 and a first input/output control circuit 480.

The first logic circuit 470 receives a serial clock signal SCK, a chip select signal/CS, a control signal/HOLD, and a control signal/WP from the host apparatus 5. The chip select signal/CS is a signal for activating the memory system 1 (in other words, a signal that is activated when access to the memory system 1 is made) and is asserted ("L" level) when the host apparatus 5 inputs a command to the memory system 1. The control signal/HOLD is asserted ("L" level), for example, when communication between the host apparatus 5 and the memory system 1 is temporarily stopped. The control signal/WP is a write protect signal and is asserted ("L" level) when an update of a specific bit in a characteristics table storing information or setting data of the memory system 1 is disabled.

The first input/output control circuit 480 receives serial data SI from the host apparatus 5. If the serial data SI is an address, the first input/output control circuit 480 causes the address register 420 to hold the address. Moreover, if the serial data SI is a command, the first input/output control circuit 480 causes the command register 430 to hold the command. Furthermore, if the serial data SI is data, the first input/output control circuit 480 causes the data register 460 to hold the data. In addition, the first input/output control circuit 480 sends serial data SO to the host apparatus 5.

The NAND interface circuit 3 includes a second logic circuit 490 and a second input/output control circuit 500.

The second logic circuit 490 receives a chip enable signal/CE, a command latch enable signal CLE, an address latch enable signal ALE, a write enable signal/WE, a read enable signal/RE, and a write protect signal/WP. The signal/CE is a signal for activating the memory system 1 and asserted at a low level, and is asserted when access to the memory system 1 is carried out. The signals CLE and ALE are signals which inform the memory system 1 that input signals I/O to the memory system 1 area command and an address, respectively. The signal /WE is a signal for causing the memory system 1 to take in an input signal I/O and asserted at a low level. The signal/RE is a signal for reading an output signal I/O from the memory system 1 and asserted at a low level. The ready/busy signal /RB is a signal indicating whether or not the memory system 1 is in a ready state (a state in which the memory system 1 can receive an instruction from the host apparatus 5) or a busy state (a state in which the memory system 1 cannot receive an instruction from the host apparatus 5), and a low level of the ready/busy signal/RB indicates the busy state.

The second input/output control circuit 500 receives a signal IO[n:0]. Then, if the signal IO is an address (if ALE="H"), the second input/output control circuit 500 causes the address register 420 to hold the address. Moreover, if the signal IO is a command (if CLE="H"), the second input/output control circuit 500 causes the command register 430 to hold the command. Furthermore, if the signal IO is data (if ALE=CLE="L"), the second input/output control circuit 500 causes the data register 460 to hold the data.

The signals SCK, /CS, /HOLD, /WP, SI, SO, /CE, CLE, ALE, /WE, /RE, /WP, and IO are supplied from the outside of the memory system 1 via different terminals. These terminals are provided on the same semiconductor substrate as the serial interface circuit 2, the NAND interface circuit 3, and the memory circuit 4.

The status register 410 holds various kinds of status information of the memory system 1. Examples of the status information include the above-described number of error bits provided from the ECC circuit 400 and information, which is provided from the control circuit 440, indicating whether write operation and erasing operation were successfully performed (passed) or unsuccessfully performed (failed).

The control circuit 440 controls the entire memory system 1 based on the command held in the command register 430 and various signals input to the first logic circuit 470 or the second logic circuit 490. Moreover, while the NAND interface circuit 3 is selected, the control circuit 440 generates the ready/busy signal/RB and outputs the ready/busy signal/RB to the host apparatus 5.

The voltage generating circuit 450 generates a voltage necessary for data write, read, and erasing operations based on the instruction of the control circuit 440 and supplies the voltage to the memory cell array 110, the row decoder 120, and the sense amplifier 130.

As depicted in FIG. 2, the memory circuit 4 is connected to both the serial interface circuit 2 and the NAND interface circuit 3 and can process the instructions of the host apparatus 5, which can be received via each of the serial interface circuit 2 and the NAND interface circuit 3.

1.2 Data Write Operation in Accordance with SPI

Next, data write operation in accordance with SPI carried out in the memory system 1 according to the present embodiment (data write operation which is performed when the serial interface circuit 2 is selected) will be briefly described below, focusing on signals which are sent and received over the SPI bus.

Figure 3:
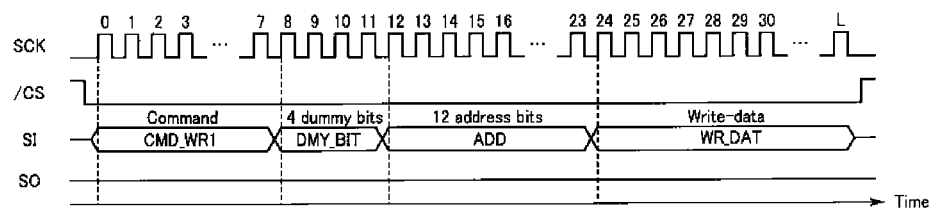
FIGS. 3 and 4 each are a timing chart of various signals in accordance with SPI that are processed the memory system according to the first embodiment at the time of writing data.

FIG. 3 is a time chart of various signals on the SPI bus. As depicted in FIG. 3, the host apparatus 5 asserts the signal /CS, issues a first write command CMD_WR1 as the signal SI, and inputs the clock SCK. The serial interface circuit 2 recognizes the signal SI received from the host apparatus 5 at the timing when the signal/CS was asserted as a command. Specifically, the serial interface circuit 2 recognizes the signal SI first received in synchronism with the clock SCK after the signal/CS was asserted as a command. This command is an 8-bit signal input in 8 clock cycles, for example. As a result of receiving the first write command CMD_WR1, the control circuit 440 starts a data write sequence.

The host apparatus 5 subsequently sends a dummy bit DMY_BIT to the serial interface circuit 2 in 4 clock cycles, for example, and then sends an address ADD to the serial interface circuit 2 in 12 clock cycles, for example. This address ADD is an address for designating an area of the data register 460 and an address that designates a column in a page of the memory cell array 110. The address ADD is held in the address register 420. Furthermore, the host apparatus 5 sends write data WR_DAT to the serial interface circuit 2. This write data WR_DAT is held in an area of the data register 460 corresponding to the ADD received immediately before the reception of the write data WR_DAT. After sending the data WR_DAT, the host apparatus 5 deasserts the signal/CS.

As described above, what type of signal is input after a particular command is received (a command sequence) is determined in advance. By recognizing this command sequence determined in advance, the serial interface circuit 2 determines the type of the signal SI that is input in a certain clock cycle after the reception of the command and stores the input signal SI in a register or a buffer corresponding to various signals such as an address. That is, the serial interface circuit 2 understands that, if the serial interface circuit 2 receives, for example, a first write command, the signal SI that is input in the following 4 clock cycles is meaningless dummy data and the signal SI that is input in the following 12 clock cycles is a substantial address signal.

Figure 4:
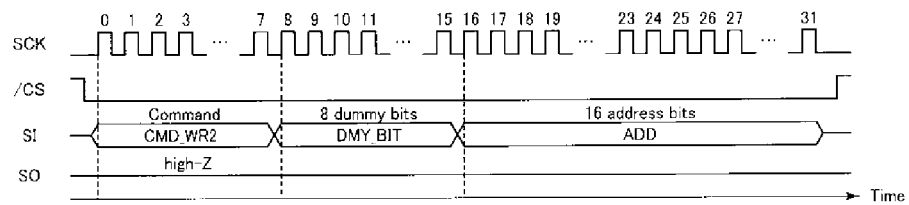

Next, FIG. 4 will be explained. As is the case with FIG. 3, FIG. 4 is a time chart of various signals on the SPI bus and depicts signals that are sent and received after sending and receiving the signals depicted in FIG. 3. After sending a second write command CMD_WR2, the host apparatus 5 sends an 8-bit dummy bit DMY_BIT in 8 clock cycles, for example, and then sends a 16-bit address ADD to the serial interface circuit 2 in 16 clock cycles, for example. This address ADD is an address of a block and a page of the memory cell array 110 and is held in the address register 420. After sending the address ADD, the host apparatus 5 deasserts the signal/CS. Then, the write data WR_DAT are written into the memory cell array 110.

1.3 Data Write Operation in Accordance with NAND Interface

Next, a data write operation in accordance with the NAND interface carried out in the memory system 1 according to the present embodiment (data write operation which is performed when the NAND interface circuit 3 is selected) will be briefly described below, focusing on signals which are sent and received over the NAND bus.

Figure 5:
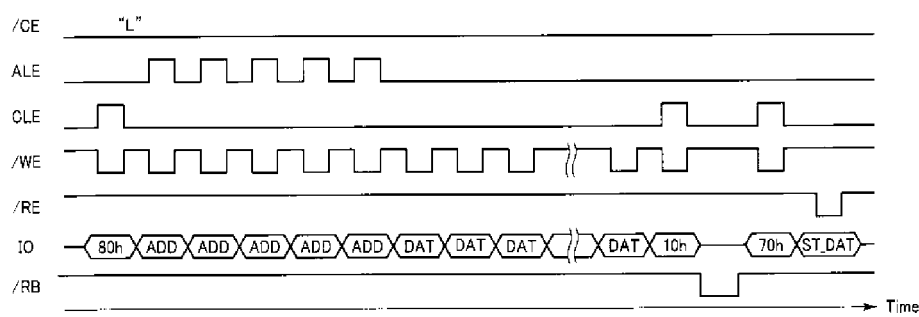
FIG. 5 is a timing chart of various signals in accordance with a NAND interface that are processed in the memory system according to the first embodiment at the time of writing data.

FIG. 5 is a time chart of various signals on the NAND bus. The host apparatus 5 issues a write command "80h" and sends the write command "80h" to the NAND interface circuit 3. The host apparatus 5 subsequently sends an address ADD to the NAND interface circuit 3 in 5 clock cycles, for example, and write data DAT is then sent to the NAND interface circuit 3 in multiple clock cycles. The host apparatus 5 then issues a write command "10h" and sends the write command "10h" to the NAND interface circuit 3. It is noted that this address ADD contains an address indicating a block, a page, and a column which are held in the address register 290 through the operation depicted in FIGS. 3 and 4.

In response to the command "10h", in the memory system 1, operation to write data into the memory cell array 110 is started, and the memory system 1 enters a busy state (/RB="L").

When writing of data into the memory cell array 110 is completed, the memory system 1 enters a ready state. In response, the host apparatus 5 issues a status read command "70h" and toggles the signal/RE. In synchronism with the signal/RE, status data ST_DAT indicating whether the write operation passed or failed is transferred to the host apparatus 5.

1.4 Package of Memory System

Figure 6:
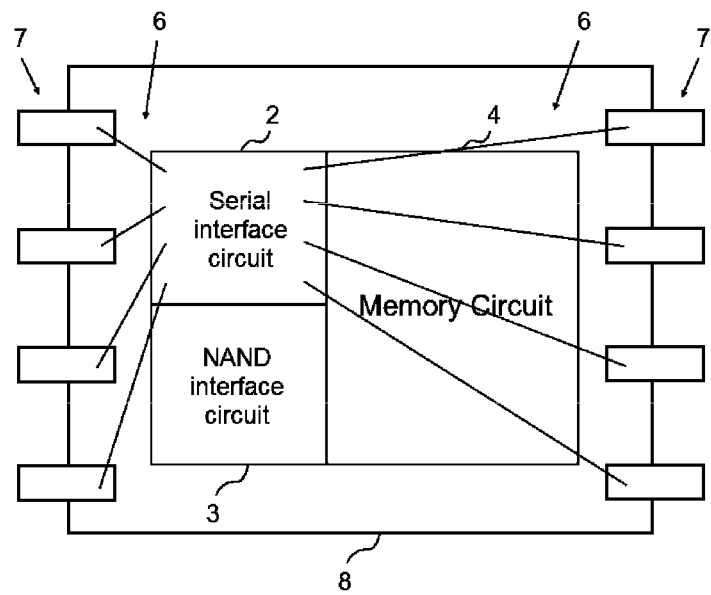
FIG. 6 illustrates a configuration of a package of the memory system according to the first embodiment.

FIG. 6 illustrates a configuration of a package of the memory system 1 according to the first embodiment. FIG. 6 depicts a case where the serial interface circuit 2 is selected.

Each of the terminals of the serial interface circuit 2 for the signals SCK, /CS, /HOLD, /WP, SI, and SO is connected to one end of a corresponding external connecting terminal 7 via a connecting wire 6. On the other hand, the terminals of the NAND interface circuit 3 for the signals/CE, CLE, ALE, /WE, /RE, /WP, and IO are not connected to the external connecting terminals 7.

The serial interface circuit 2, the NAND interface circuit 3, the memory circuit 4, and the connecting wires 6 are covered with a resin 8, for example. The other end of each external connecting terminal 7 is exposed (i.e., not covered by the resin 8). Various signals are input to the other ends of the external connecting terminals 7 from the host apparatus 5.

FIG. 6 depicts the case where the serial interface circuit 2 is selected. If the NAND interface circuit 3 is selected, each of the terminals of the NAND interface circuit 3 for the signals/CE, CLE, ALE, /WE, /RE, /WP, and IO is connected to one end of the corresponding external connecting terminal 7 via the connecting wire 6, and the terminals of the serial interface circuit 2 for the signals SCK, /CS, /HOLD, /WP, SI, and SO are not connected to the external connecting terminals 7.

As described above, by connecting only the terminals of one of the serial interface circuit 2 and the NAND interface circuit 3 to the external connecting terminals 7, one of the serial interface circuit 2 and the NAND interface circuit 3 is selected as a circuit to which the signals are input from the host apparatus 5.

Moreover, for example, the setting data are stored in the ROM 160 and only one of the serial interface circuit 2 and the NAND interface circuit 3 is activated based on the setting data.

1.5 Manufacturing Method

Figure 7:
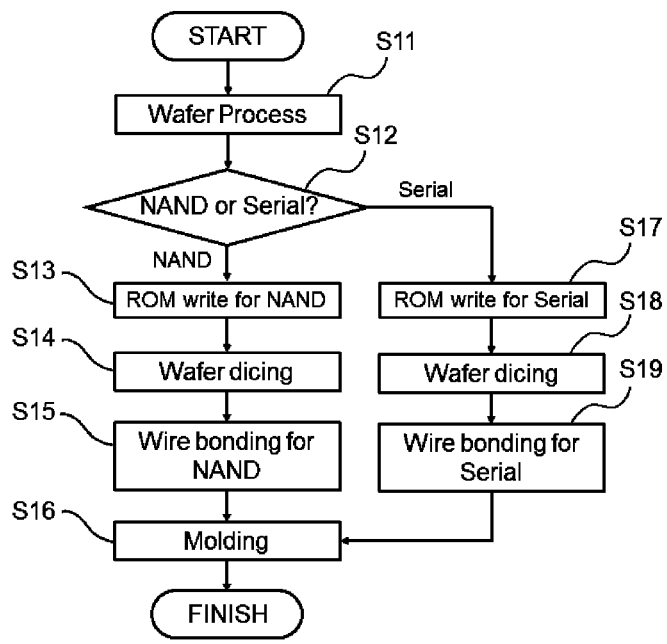
FIG. 7 is a flowchart of a method for manufacturing the memory system according to the first embodiment.

Next, a method for manufacturing the memory system 1 according to the first embodiment will be described. FIG. 7 is a flowchart of the method for manufacturing the memory system 1 according to the first embodiment.

First, by a semiconductor process, the serial interface circuit 2, the NAND interface circuit 3, and the memory circuit 4 are formed on a semiconductor wafer (Step S11).

Next, a determination is made as to whether SPI or the NAND interface is employed as the interface of the memory system 1 (Step S12). If it is determined that the NAND interface is employed as the interface of the memory system 1, the setting data for activating the NAND interface circuit 3 is written into the ROM 160 (Step S13). Next, the semiconductor wafer is diced, whereby the semiconductor wafer is divided into individual semiconductor chips (Step S14). Then, each of the individual semiconductor chips are mounted on a supporting member such as a lead frame, and the terminals of the NAND interface circuit 3 are connected to the external connecting terminals 7 via the connecting wires 6 by wire bonding (Step S15). Finally, each of the semiconductor chips is encapsulated in the resin 8, whereby the memory system 1 depicted in FIG. 6 is manufactured (Step S16).

On the other hand, if it is determined in Step S12 that SPI is employed as the interface of the memory system 1, the setting data for activating the serial interface circuit 2 is written into the ROM 160 (Step S17). Then, the semiconductor wafer is diced, whereby the semiconductor wafer is divided into individual semiconductor chips (Step S18). Step S18 is similar to Step S14. Then, each of the individual semiconductor chips is mounted on a supporting member such as a lead frame, and the terminals of the serial interface circuit 2 are connected to the external connecting terminals 7 via the connecting wires 6 by wire bonding (Step S19). Then, the procedure proceeds to Step S16, and the semiconductor chips are encapsulated in the resin.

1.6 Advantage of the First Embodiment

If a memory system conforming only to SPI and a memory system conforming only to the NAND interface are separately produced, SPI-based signal processing cannot be carried out by the memory system conforming to the NAND interface, and NAND-interface-based signal processing cannot be carried out by the memory system conforming to SPI. In this regard, the memory system 1 according to the present embodiment can carry out signal processing conforming to either one of SPI and the NAND interface, by simply changing the wiring connection. Moreover, the serial interface circuit 2 and the NAND interface circuit 3 are connected to a single memory circuit 4. Since no separate peripheral circuit of the memory circuit 4 (elements other than the memory cell array 110), increase in the size of the memory system 1 is prevented. Furthermore, since the memory system 1 according to the present embodiment selects one of SPI and the NAND interface during a packaging process which is performed late in the semiconductor chip production process, i.e., immediately before shipment of a product, the memory system 1 according to the present embodiment can provide a memory system conforming to a desired interface by simply changing wiring connection according to changes in market demands.

2. Second Embodiment

A memory system according to a second embodiment will be described.

2.1 Configuration of Memory System 2.1.1 Schematic Configuration

Figure 8:
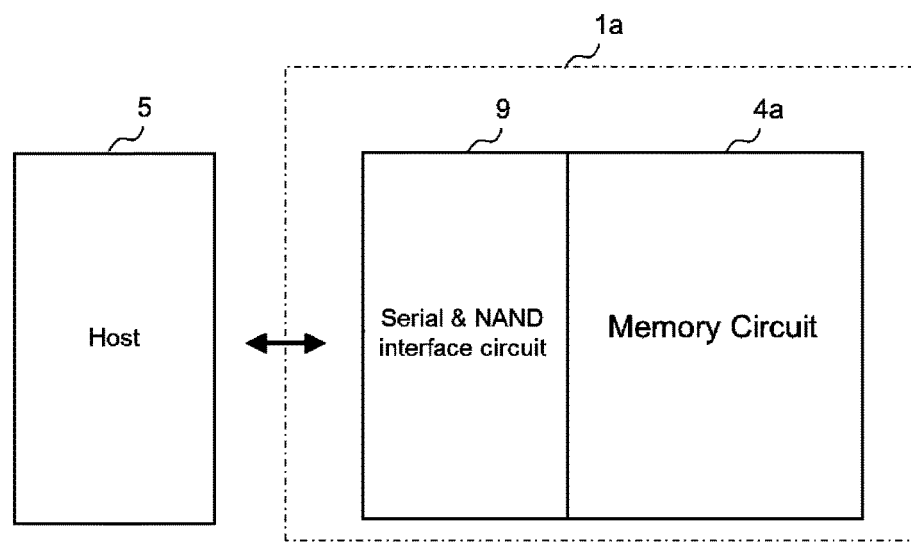
FIG. 8 illustrates a schematic configuration of a memory system according to a second embodiment.

A schematic configuration of the memory system according to the present embodiment will be described with reference to FIG. 8. FIG. 8 illustrates a schematic configuration of the memory system according to the present embodiment.

As compared to the memory system 1 according to the first embodiment, in a memory system 1a according to the present embodiment, functions of the serial interface circuit 2 and the NAND interface circuit 3 depicted in FIG. 1 are performed by a serial & NAND interface circuit 9. Moreover, in addition to the functions of the memory circuit 4 depicted in FIG. 1, a memory circuit 4a has a function of switching the interface of the serial & NAND interface circuit 9 between SPI and the NAND interface in response to a command received by the serial & NAND interface circuit 9 from a host apparatus 5.

2.1.2 Detailed Configuration

Figure 9:
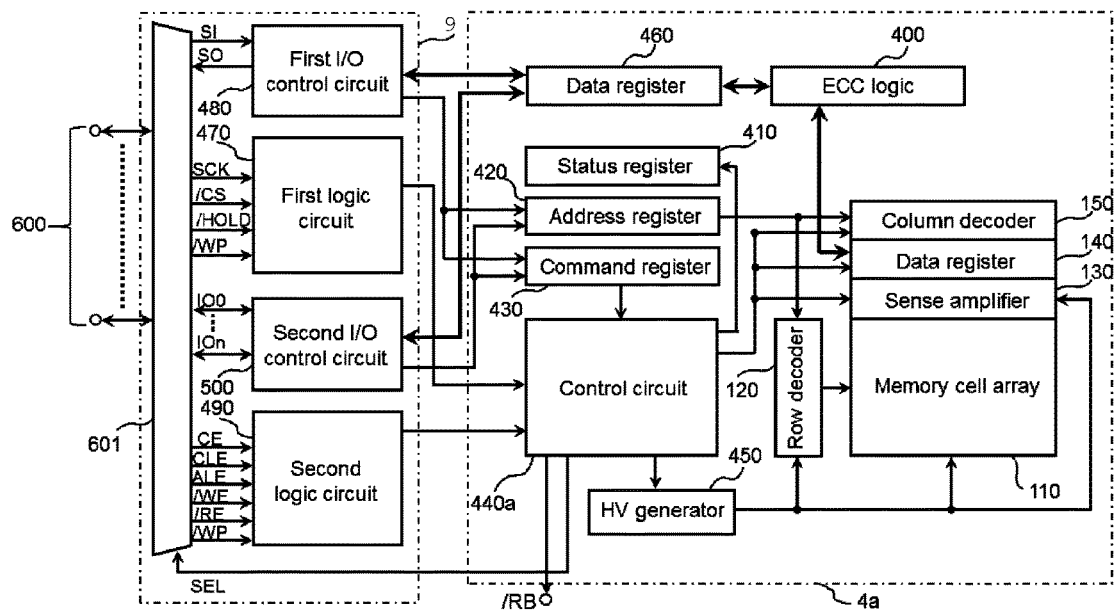
FIG. 9 illustrates a detail configuration of the memory system according to the second embodiment.

FIG. 9 illustrates a detail configuration of the memory system 1a according to the present embodiment. Here, descriptions will focus on portions which are different from the configuration of the first embodiment depicted in FIG. 2.

The serial & NAND interface circuit 9 includes a first logic circuit 470, a first input/output control circuit 480, a second logic circuit 490, and a second input/output control circuit 500. One of the circuit (the first logic circuit 470 and the first input/output control circuit 480) operating as SPI and the circuit (the second logic circuit 490 and the second input/output control circuit 500) operating as the NAND interface is selected as the initial setting when the memory system 1a is turned on. This selected one circuit receives, from the host apparatus 5, a command SW for switching from the originally-selected one interface to the other interface and stores the command SW in a command register 430. Based on the command SW stored in the command register 430, a control circuit 440a inactivates the originally-selected one of (i) the first logic circuit 470 and the first input/output control circuit 480 and (ii) the second logic circuit 490 and the second input/output control circuit 500, and activates the other circuit.

The memory system 1a has a plurality of terminals 600. The terminals 600 are formed on the same semiconductor substrate as the serial & NAND interface circuit 9 and the memory circuit 4a. When SPI is selected as the interface of the memory system 1a, signals SCK, /CS, /HOLD, /WP, SI, and SO on SPI are supplied from the host apparatus 5 to the terminals 600. On the other hand, when the NAND interface is selected as the interface of the memory system 1a, signals /CE, CLE, ALE, /WE, /RE, /WP, and IO on the NAND interface are supplied from the host apparatus 5 to the terminals 600.

The serial & NAND interface circuit 9 also includes a multiplexer (switch circuit) 601. To input terminals of the multiplexer 601, a plurality of signal lines (hereinafter referred to as an input signal line group) to which the signals are input from the host apparatus 5 via the terminals 600 are connected. To output terminals of the multiplexer 601, a plurality of signal lines (hereinafter referred to as a first output signal line group) that propagate the signals SCK, /CS, /HOLD, /WP, SI, and SO on SPI to the first logic circuit 470 and the first input/output control circuit 480 are connected. Moreover, to the output terminals of the multiplexer 601, a plurality of signal lines (hereinafter referred to as a second output signal line group) that propagate the signals/CE, CLE, ALE, /WE, /RE, /WP, and IO on the NAND interface to the second logic circuit 490 and the second input/output control circuit 500 are connected. The control circuit 440a outputs a selection signal SEL to the multiplexer 601 in response to the command SW. The multiplexer 601 switches a connection destination of the input signal line group between the first output signal line group and the second output signal line group based on the selection signal SEL. Specifically, when SPI is selected, the multiplexer 601 connects at least part of the input signal line group to the first output signal line group. At this time, for example, the signal/CS supplied from the host apparatus 5 to the multiplexer 601 is output to the first logic circuit 470 as the signal/CS via the corresponding signal line of the first output signal line group. Moreover, when the NAND interface is selected, the multiplexer 601 connects at least part of the input signal line group to the second output signal line group. At this time, for example, the signal/CE supplied from the host apparatus 5 to the multiplexer 601 is output to the second logic circuit 490 as the signal/CE via the corresponding signal line of the second output signal line group.

Furthermore, in at least some of the terminals 600, the terminals to which the signals on SPI are input and the terminals to which the signals on the NAND interface are input are the same. In other words, of the terminals 600, at least some of the terminals which receive the signals on SPI which will be received by the first logic circuit 470 and the first input/output control circuit 480 via the multiplexer 601 and at least some of the terminals which receive the signals on the NAND interface which will be received by the second logic circuit 490 and the second input/output control circuit 500 via the multiplexer 601 are the same.

2.2 Manufacturing Method

Figure 10:
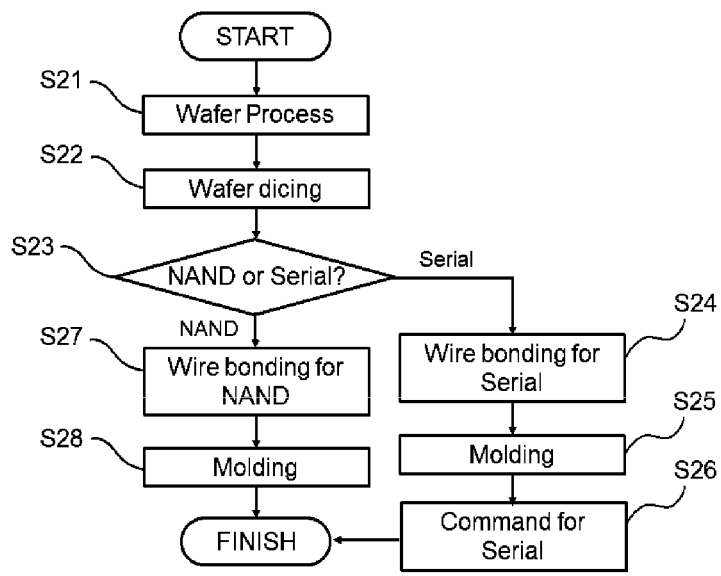
FIG. 10 is a flowchart of a method for manufacturing the memory system according to the second embodiment.

Next, a method for manufacturing the memory system 1a according to the second embodiment will be described. FIG. 10 is a flowchart of the method for manufacturing the memory system 1a according to the second embodiment. A case where the initial setting of the interface of the memory system 1a at power-on is the NAND interface will be described with reference to FIG. 10.

First, by a semiconductor process, the serial & NAND interface circuit 9 and the memory circuit 4a are formed on a semiconductor wafer (Step S21). Next, the semiconductor wafer is diced, whereby the semiconductor wafer is divided into individual semiconductor chips (Step S22). Then, each individual semiconductor chip is mounted on a supporting member such as a lead frame, and a determination is made as to whether the interface of the memory system 1a is set to SPI or the NAND interface (Step S23). If it is determined that the interface of the memory system 1a is set to SPI, the terminals of the terminals 600 which are used for transfer of the signals on SPI and external connecting terminals are connected by wire bonding (Step S24). Next, the semiconductor chips are encapsulated in the resin 8 (Step S25). Next, the host apparatus 5 issues, to the memory system 1a, a command SW that switches the interface of the memory system 1a to SPI (Step S26). In response to the command SW, the memory system 1a switches the interface to SPI.

On the other hand, if it is determined in Step S23 that the interface of the memory system 1a is set to the NAND interface, the terminals of the terminals 600 on the semiconductor chip which are used for transfer of the signals on the NAND interface and external connecting terminals are connected by wire bonding (Step S27). Next, the semiconductor chips are encapsulated in the resin 8 (Step S28). If the interface of the memory system 1a is switched to SPI, the interface of the memory system 1a is switched by the command SW in Step S26; in the case of the NAND interface, since there is no need to switch the interface and the initial setting is used as it is, the process ends here.

2.3 Advantage of the Second Embodiment

As in the first embodiment, the memory system 1a according to the present embodiment can arbitrarily select one of SPI and the NAND interface.

Furthermore, in the memory system 1a according to the present embodiment, in at least some of the terminals 600, the terminals to which the signals on SPI are input and the terminals to which the signals on the NAND interface are input are the same. As a result, the number of terminals for signal input does not need to be increased as a result of configuring the memory system so as to conform to either of the two interfaces, SPI and the NAND interface.

3 Modified Example

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the memory systems according to the first and second embodiments include the ECC circuit 400, but the memory systems according to the first and second embodiments may not include the ECC circuit 400. Moreover, in the second embodiment, the memory circuit 4a has the function of switching the interface of the serial & NAND interface circuit 9 between SPI and the NAND interface, but the serial & NAND interface circuit 9 may have this function.

Furthermore, in the second embodiment, the circuit (the first logic circuit 470 and the first input/output control circuit 480) operating as SPI and the circuit (the second logic circuit 490 and the second input/output control circuit 500) operating as the NAND interface are formed as circuits which are physically separated from each other. However, the embodiment is not limited thereto. Only one of the circuit operating as SPI and the circuit operating as the NAND interface simply has to operate selectively, and part of the circuit operating as SPI and part of the circuit operating as the NAND interface may be formed as a common circuit. When the signals on SPI and the signals on the NAND interface are transmitted via the same terminals 600, by transmitting similar type of signals via a same terminal, a circuit which is connected to the subsequent stage of that terminal can be easily shared by SPI and the NAND interface. Examples of the similar type of signals include/CS and/CE, and SI and IO.

Moreover, in the memory system 1 according to the first embodiment, one of SPI and the NAND interface is selected by wire bonding and the setting data in the ROM 160. In the memory system 1a according to the second embodiment, one of SPI and the NAND interface is selected by a command from the host apparatus 5. However, various other selection methods are possible. For example, nonvolatile memory which is different from the ROM 160 may be prepared and setting data for selecting the interface may be stored in the nonvolatile memory. Moreover, the interface may be selected depending on whether a terminal on a semiconductor chip is connected to power-supply wiring, for example, by a connecting wire and a power-supply voltage is supplied to the terminal or the terminal is not connected to the power-supply wiring and the power-supply voltage is not supplied to the terminal.

What is claimed is:

1. A storage device comprising:
a nonvolatile semiconductor memory module;
a switch circuit connected to terminals for connection to a host;
a first interface circuit connected to the nonvolatile semiconductor memory module and the switch circuit; and
a second interface circuit connected to the nonvolatile semiconductor memory module and the switch circuit, and conforming to an interface standard different from an interface standard of the first interface circuit, wherein
the switch circuit is configured to transmit a command from the host to one of the first interface circuit and the second interface circuit, and
the switch circuit is configured to switch between communication with the first interface circuit and communication with the second interface circuit, based on a command from the nonvolatile semiconductor memory module.

2. The storage device according to claim 1, wherein
the nonvolatile semiconductor memory module, the switch circuit, the first interface circuit, and the second interface circuit are formed on a substrate.

3. The storage device according to claim 1, wherein
one of terminals of the first interface circuit connected to the nonvolatile semiconductor memory module is common to one of terminals of the second interface circuit connected to the nonvolatile semiconductor memory module.

4. The storage device according to claim 1, wherein
one of terminals of the first interface circuit connected to the switch circuit is common to one of terminals of the second interface circuit connected to the switch circuit.

5. The storage device according to claim 1, wherein
the first interface circuit includes first, second, and third terminals, and is configured to transmit, from the first terminal, as a command, an initial portion of a signal received through the second terminal after a chip select signal is received through the third terminal, and
the second interface circuit includes fourth, fifth, and sixth terminals, and is configured to transmit, from the fourth terminal, as a command, a portion of a signal received through the fifth terminal while a command latch enable signal received through the sixth terminal is asserted.

6. The storage device according to claim 1, wherein
the first interface circuit conforms to Serial Peripheral Interface (SPI), and
the second interface circuit conforms to an interface of a NAND flash memory.

7. A method for manufacturing a storage device, comprising:
forming a nonvolatile semiconductor memory module;
forming a first interface circuit;
forming a second interface circuit conforming to an interface standard different from an interface standard of the first interface circuit;
connecting one of the first interface circuit and the second interface circuit to the nonvolatile semiconductor memory module via first wiring, and to terminals of the storage device for connection to a host via second wiring;
storing setting data conforming to the first interface circuit in a storage of the nonvolatile semiconductor memory module, when the first interface circuit is selected; and
storing setting data conforming to the second interface circuit in the storage of the nonvolatile semiconductor memory module, when the second interface circuit is selected.

8. The method according to claim 7, wherein
the nonvolatile semiconductor memory module, the first interface circuit, and the second interface circuit are formed on a substrate.

9. The method according to claim 7, wherein
one of terminals of the first interface circuit for connection to the nonvolatile semiconductor memory module is common to one of terminals of the second interface circuit for connection to the nonvolatile semiconductor memory module.

10. The method according to claim 7, wherein
one of terminals of the first interface circuit for connection to the host is common to one of terminals of the second interface circuit for connection to the host.

11. The method according to claim 7, wherein
the first interface circuit conforms to Serial Peripheral Interface (SPI), and
the second interface circuit conforms to an interface of a NAND flash memory.

* * * * *